United States Patent [19]

Takemoto et al.

[11] 4,148,048
[45] Apr. 3, 1979

[54] SOLID-STATE IMAGING DEVICE

[75] Inventors: Iwao Takemoto, Kodaira; Norio Koike, Tokyo; Masaharu Kubo, Hachioji, all of Japan

[73] Assignee: Hitachi, Ltd., Japan

[21] Appl. No.: 871,252

[22] Filed: Jan. 23, 1978

[30] Foreign Application Priority Data

Jan. 24, 1977 [JP] Japan .................................. 52/5953
Apr. 1, 1977 [JP] Japan .................................. 52/36163

[51] Int. Cl.² ......................................... H01L 27/14
[52] U.S. Cl. ........................................ 357/30; 357/24;
357/41; 307/304; 307/311
[58] Field of Search ................... 357/30, 31, 24, 41;
307/311, 304

[56] References Cited

U.S. PATENT DOCUMENTS

| | | | |
|---|---|---|---|
| 3,983,395 | 9/1976 | Kim | 250/370 |
| 3,988,619 | 10/1976 | Malavuja | 307/311 |
| 3,996,600 | 12/1976 | Patrin | 357/30 |
| 4,028,716 | 6/1977 | van Santen | 357/24 |
| 4,028,719 | 6/1977 | Curtis | 357/30 |
| 4,045,817 | 8/1977 | Nakatani | 358/213 |
| 4,067,046 | 1/1978 | Nakutani | 358/213 |

Primary Examiner—Martin H. Edlow
Attorney, Agent, or Firm—Craig & Antonelli

[57] ABSTRACT

A solid-state imaging device contains a photoelectric part in which a plurality of picture elements each consisting of a photodiode and a switching transistor are arranged in two dimensions. The picture elements are disposed on the same semiconductor substrate, and scanning circuits which scan the switching transistors of the photoelectric part in succession are provided. The solid-state imaging device further comprises a semiconductor layer which has a conductivity type opposite to that of the semiconductor substrate and which is disposed in one major surface of the semiconductor substrate and means for applying a reverse bias between the semiconductor layer and the semiconductor substrate. At least the photoelectric part is disposed within the semiconductor layer, and a high impurity concentration region which has the same conductivity type as that of the semiconductor layer and is disposed at least under a part of the photodiode.

22 Claims, 34 Drawing Figures

SOLID-STATE IMAGING DEVICE

BACKGROUND OF THE INVENTION (1) Field of the Invention

This invention relates to a solid-stage image pickup device for use in a television camera etc. Particularly, it relates to a solid-state imaging device which has a plurality of picture elements disposed in a surface region of a semiconductor body. More specifically, it relates to a solid-state device which has picture elements for reading out from photodiodes photo information stored therein.

(2) Description of the Prior Art

As a prior-art solid-state imaging device, there has been one as shown in FIG. 1 and FIG. 2.

FIG. 1 shows a typical example of the construction of a two-dimensional solid stage imaging device. A photodiode 1 and an insulated-gate field effect transistor (hereinbelow, termed "MOS Tr") 2 make up a picture element as a unit. The array of the picture elements is selected by a horizontal scanning circuit (horizontal scanner) 9 and a vertical scanning circuit (vertical scanner) 10 each of which is a shift register formed of, for example, MOS Tr's. Thus, MOS Tr's 3 and 2 are respectively turned "on" and scanned in succession. By the scanning, charges having been produced by light as stored in the photodiodes 1 are led out from an output terminal 8 through signal lines 5 and 6, and picture signals which the picture elements have received are taken out as electric signals. For some purposes, a plurality of signal lines 6 and output terminals 8 are disposed. Shown at 20 is a voltage source for video output.

FIG. 2 shows a typical sectional structure of the picture element. Hereunder, for the sake of convenience of the description, an N-channel image pickup device in which the signal charges are electrons will be described. The following explanation is quite similarly applicable to a P-channel device by merely inverting the conductivity type and the polarity.

In the picture element illustrated in FIG. 2, the photodiode is formed of a silicon (Si) body 11 made of single crystal silicon of the p-type conductivity and a diffused layer 12 of the n-type conductivity. The n-type diffused layer 12 simultaneously serves as a source, to form the insulated-gate field effect transistor (MOS Tr) along with a gate electrode 13 made of, e.g., polycrystalline silicon, a silicon dioxide ($SiO_2$) film 16 being thin under the gate electrode 13 and an n-type diffused layer 14 serving as a drain. The n-type diffused layer 14 is usually provided with an electrode 17 of a metal such as aluminum (Al) in order to lower the electric resistance thereof, and the electrode 17 is employed as the signal line 5 in FIG. 1. The $SiO_2$ film is usually thickened outside the picture element (at 16') in order to suppress the generation of an unnecessary parasitic capacitance.

Upon incidence of light 15, electron-hole pairs are created in the n-type diffused layer 12 and the Si body 11. The electrons in the pairs flow into the n-type diffused layer 12 as the signal charges, and are stored in a pn-junction capacitance 18 between the n-type diffused layer 12 and the Si body 11. When a positive scan pulse is impressed on the gate electrode 13, the electrons are drawn by and to the n-type diffused layer (drain) 14 held in a positive potential and are led out to the output terminal 8.

The potential of the n-type diffused layer 12 consequently becomes a positive potential, which drops because the pn-junction capacitance 18 continues to store electrons developed by the light 15 until the next positive scan pulse is impressed.

Such a prior-art solid-stage imaging device, especially the photodiode being the heart thereof, structurally involves four disadvantages to be described hereunder. Accordingly, notwithstanding that a practical solid-state imaging device is eagerly desired, it is not yet realized.

The first problem concerns the spectral response or the spectral sensitivity characteristics. The absorption of light by silicon differs depending on the wavelength. The absorption factors of red light (wavelength: 0.65 $\mu$m), green light (0.55 $\mu$m) and blue light (0.45 $\mu$m) constituting the primary colors are indicated as R, G and B in FIG. 3, respectively. The blue light at B creates electron-hole pairs in the vicinity of the surface of silicon, while the red light at R penetrates deep into silicon and creates electron-hole pairs. In the surface of silicon, the probability at which the recombination takes place to extinguish the electron-hole pairs is high, and the sensitivity lowers. As a result, the photodiode employing silicon is highly sensitive to only the red light (light of longer wavelength). Further, the number of electron-hole pairs is inversely proportional to the wavelength with respect to an identical energetical intensity of light, with the result that the sensitivity to the light of longer wavelength becomes still higher. Therefore, the spectral response of the photodiode becomes a distorted one in which the sensitivity is higher on the longer wavelength side. Accordingly, in the case where the electric signals obtained from the prior-art imaging device are reproduced into a picture, the picture becomes an unnatural one in which a blue part of an object is blackish and a red part is whitish.

The second problem concerns the impingement of intense incident light. Although the junction capacitance 18 in FIG. 2 is naturally saturated when the light 15 is intense, a large number of electron-hole pairs are created even in a deep part of the silicon body 11 as illustrated in FIG. 3. In the electron-hole pairs, the electrons being minority carriers do not always advance towards the particular n-type diffused layer, but they also diffuse in the lateral direction to be injected into the adjacent n-type diffused layer. As a result, the optical signal spreads among many picture elements. Due to the spreading, not only the resolution is degraded, but also a large bright area appears in the reproduced picture, so that the picture frame is spoiled (this phenomenon is called "blooming"). In the prior art including different types of imaging devices, for example, one employing charge transfer devices (charge coupled devices etc.) in a scanning system, the phenomenon occurs conspicuously.

The third problem concerns uniformity in the device characteristics. Ordinarily, the impurity concentration of the silicon body 11 varies 10% or more locally. This nonuniformity is attributed to the manufacturing process of single crystal silicon. In order to suppress the variation to a small value, it must be determined that the silicon body 11 will become very expensive.

The nonuniformity of the impurity concentration of the silicon body 11 gives rise to nonuniformity in the pn-junction capacitances 18 and nonuniformity in the operating characteristics of the MOS Tr's, and it becomes a cause for conspicuously degrading the quality of the reproduced picture.

The fourth problem is that the picture element needs to be made small in order to enhance the resolution, which inevitably renders the area of the n-type diffused layer 12 small. In consequence, the junction capacitance 18 becomes small, and the quantity of electrons, i.e., signal charges which can be stored decreases. In particular, the area of the n-type diffused layer 14 from which the signal charges are taken out is made small to the utmost irrespective of the size of the picture element, and bearing the strain, the n-type diffused layer 12 is reduced further conspicuously. Moreover, the number of the n-type diffused layers 14 to be connected with the signal line 5 in FIG. 1 increases with the number of the picture elements, and each n-type diffused layer 14 has a junction capacitance 19 (FIG. 2), so that a large capacitance with the junction capacitances combined with parasitic capacitances of the signal lines 5 and 6 develops. As a result of the above, the electric signal appearing at the output terminal 8 is very small, is buried in electric noise and cannot be detected. With the present technology, therefore, a resolution to the extent of that of a television picture cannot be attained.

Ordinarily, this problem can be solved if the junction capacitance 18 is enhanced approximately 1 order. The junction capacitance 18 is increased by raising the impurity concentration of the silicon body 11. Since, however, the junction capacitance 19 increases simultaneously, this method is imperfect.

On account of the problems as described above, the prior-art imaging device has poor resolution, and its working conditions are extremely limited, so that practical use is hindered.

Among the problems stated above, the inadequacy of the spectral response can be compensated by using a pre-filter which absorbs the light of longer wavelength. However, the degradation of resolution for the light of longer wavelength and the development of blooming are unavoidable, and these become serious factors for impeding practical use. In the case of a monolithic solid-state color imaging device based on a method in which filters arranged in the form of a mosaic are superposed on a single imaging device, there is involved a new problem to be solved that the so-called color mixture occurs in which photo electrons created by light incident on, e.g., a diode for red light flow into the adjacent diode for light of another color whereby color information of electric signals to be taken out are mixed.

SUMMARY OF THE INVENTION

This invention makes improvements in the prior-art solid-state; imaging device described above.

A first object of this invention is to provide a solid-state imaging device in which the degradation of resolution attributed to the dispersion of an optical signal incident on each picture element is prevented.

A second object of this invention is to provide a solid-state imaging device which includes means for suppressing blooming ascribable to the incidence of intense light.

Another object of this invention is to enlarge the signal charge capacitance of a solid-state imaging device and improve the spectral response thereof.

To sum up, the object of this invention is to realize a practical solid-state imaging device of high picture quality and high resolution.

In the solid-state imaging device of this invention, in one principal surface of a semiconductor substrate of one conductivity type a semiconductor layer of the conductivity type opposite to that of the substrate is disposed (an epitaxially grown layer is disposed on the substrate, or a diffused layer, normally called a "Well," is disposed by introducing and diffusing an impurity into a substrate surface region), and a plurality of photoelectric elements which construct picture elements and each of which consists of a photodiode and a switching transistor are disposed in the semiconductor layer. In the solid-state imaging device of this invention, means for reverse-biasing a pn-junction formed by the semiconductor substrate and the semiconductor layer is disposed, and the photoelectric elements constructing the picture elements are successively scanned by scanning circuitry disposed in the semiconductor substrate or the semiconductor layer, to read out signals stored in the photodiodes.

Further, in the solid-state imaging device of this invention, a highly doped region of the same conductivity type as that of the semiconductor layer is disposed under at least a part of the photodiode disposed in the semiconductor layer. Owing the presence of the highly doped region, the enhancement of resolution and the reduction of blooming in the solid-state imaging device of this invention are further promoted, and the signal capacitance increases.

BRIEF DESCRIPTION OF THE DRAWINGS

FIGS. 5A and 6A are sectional views of the picture element, while FIGS. 5B, 5C, 6B and 6C are diagrams showing the relations of potentials in various places of the picture element.

FIGS. 11 and 12 are sectional views of the picture element, while FIGS. 13A, 13B and 13C are diagrams showing the relations of potentials in various places of the picture element.

DETAILED DESCRIPTION OF THE INVENTION

The principle of this invention will now be explained in comparison with the prior art.

Figure 1:
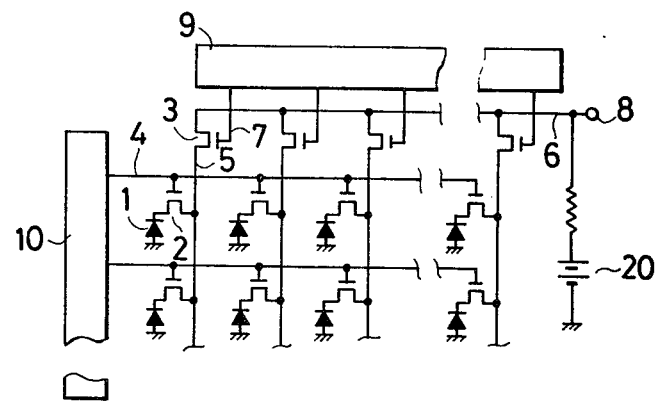
FIG. 1 is a schematic view showing the general construction of a prior-art solid-state imaging device.

Fundamentally, the solid-state imaging device of this invention adopts the construction in FIG. 1. That is, the main constituents are picture elements each of which is constructed of a photodiode 1 and a MOS Tr 2 as a switching element, and horizontal and vertical scanning circuits 9 and 10 which are made up of shift registers constructed of, e.g., MOS Tr's and which select (X, Y) coordinates of the picture elements.

Depending on a system for taking out output signals, horizontal switching transistors for selecting X positions as are formed of MOS Tr's are disposed as in FIG. 1. Of course, in some cases, scanning lines 4 are coupled with the vertical scanning circuit through vertical switching transistors for selecting Y positions.

The fundamentals of this invention, however, can cover any other modifications and improvements in the construction which comprises means for selecting (X, Y) coordinates of picture elements, and the picture elements each consisting of a photodiode and a switching element to have an (X, Y) coordinates-selecting signal impressed thereon and in which the picture elements are successively scanned to read out optical signals. By way of example, a plurality of switching transistors may be disposed for each picture element. A point of improvement of the solid-state imaging device of this invention over the prior-art device resides in the betterment of a photoelectric element serving as a picture element.

Regarding the construction of the horizontal and vertical scanning circuits for selecting the (X, Y) coordinates of the picture elements, various ones have already been known. They are described in detail in, for example, Japanese Patent Application Publication No. 50-28127, Japanese Patent Application Publication No. 44-25542, and IEEE, vol. SC-4, No. 6, 1969, S. G. Chamberlain et al., p. 333. Since they can be used as the scanning circuits of the device of this invention, no detailed description will be made.

EMBODIMENT 1

Figure 4:
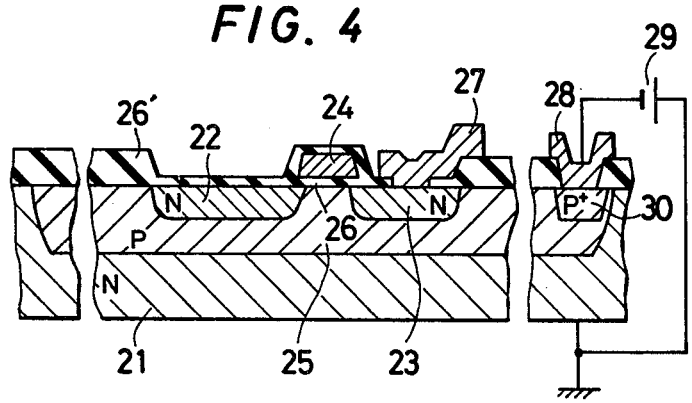
FIG. 4 is a sectional view showing the sectional structure of a picture element in a solid-state imaging device of a first embodiment of this invention.

FIG. 4 shows the sectional structure of one picture element in a solid-state imaging device of an embodiment of this invention. In a silicon (Si) substrate 21 of the n-type conductivity, a well diffused region 25 of the p-type conductivity is disposed. With the well 25 regarded as the silicon body 11 in the prior-art structure (FIG. 2), there is formed a picture element which consists of a diffusion layer of the n-type conductivity 22 constituting a photodiode, a diffusion layer of the n-type conductivity 23 serving as a drain, and a gate electrode 24.

The well 25 is reverse-biased with respect to the silicon substrate 21 by a power source 29 through a p+ diffused layer 30 for establishing ohmic contact and an electrode 28 made of a conductive material such as aluminum (Al). The p+ diffused layer 30 may be replaced with an n-type diffused layer. Since the junction between the diffused layer and the well 25 becomes forward, a predetermined bias can be applied.

Referring to FIGS. 5A, 5B, 5C 6A, 6B and 6C, the effects of this invention especially on resolution and blooming will be described in detail.

Figure 5A:
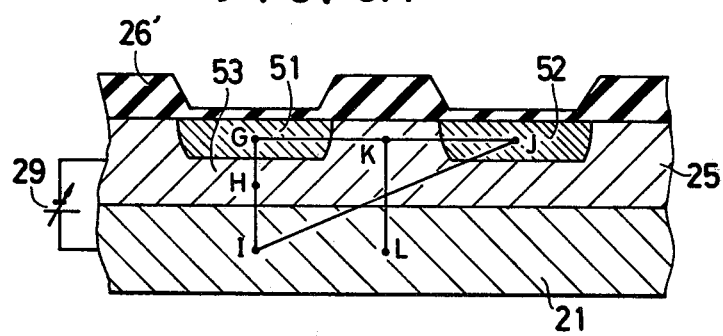
FIGS. 5A, 5B and 5C and FIGS. 6A, 6B and 6C illustrate the effects of the picture element in FIG. 4 on resolution and blooming.
Figure 5B:
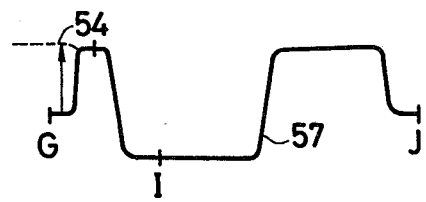
Figure 5C:
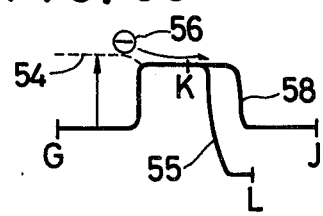

FIG. 5A is a schematic sectional view of two n-type diffused layers 51 and 52 constituting adjacent photodiodes, as well as the vicinity thereof. FIGS. 5B and 5C illustrate the relations of potentials among six points G–L which have been selected as typical points in FIG. 5A.

There will be explained the influence of light incident on the n-type diffused layer 51.

Owing to the reverse bias which is applied between the p-type well 25 and the n-type silicon substrate 21 by the power source 29, photo-electrons which take part in a signal are created only within a thin well under the n-type diffused layer 51. Electrons are majority carriers within the silicon substrate 21. As is apparent from FIG. 5B, therefore, the electrons produced at, e.g., the point I in the silicon substrate 21 cannot exceed a high barrier due to the well and can shift neither to the point G nor the point J. Since the well 53 under the n-type diffused layer 51 is thin, an electric field from the n-type diffused layer 51 acts as a drift electric field on the photo-electrons produced here, and the probability at which the photo-electrons diffuse into the n-type diffused layer 52 is very low. Further, a drift electric field from the silicon substrate 21 acts, and hence, the photo-electrons which do not advance towards the n-type diffused layer 51 flow out to the silicon substrate 21 and do not proceed towards the n-type diffused layer 52. Accordingly, not only the spectral response of the solid-state imaging device employing the silicon substrate whose sensitivity is high to only light of longer wavelength is corrected, but also the degradation of resolution ascribable to the signal outflow to the adjacent picture elements can be eliminated.

This invention also demonstrates a remarkable effect on blooming ascribable to intense incident light.

The potential of the n-type diffused layer 51 rises as in potential curves 54 in FIGS. 5B and 5C due to the intense incident light, and the injection of excess electrons into the well 25 takes place. Most of the injected electrons, however, flow out to the silicon substrate 21 through the thin well 53 situated under the n-type diffused layer 51. Further, among a small number of electrons 56 having advanced towards the n-type diffused layer 52, a component towards the point L within the silicon substrate 21 diminishes within the intervening well 25, for example, at the point K (via a potential curve 55). Therefore, electrons which can reach the n-type diffused layer 52 are of a very saml number.

Moreover, when the reverse bias between the silicon substrate 21 and the well 25 by the power source 29 is made sufficiently great, the well 53 between the n-type diffused layer 51 and the silicon substrate 21 is depleted. Thus, the barrier itself between the points G and I is lowered, the potential rise of the n-type diffused layer 51 is limited, and the injection itself of electrons into the well (followed by the injection into the n-type diffused layer 52) can be restrained. In this case, the blooming among the photodiodes can be perfectly prevented.

Figure 6A:
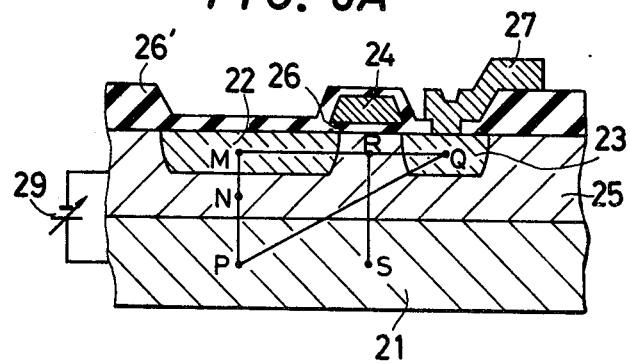
Figure 6B:
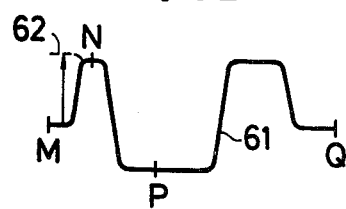
Figure 6C:
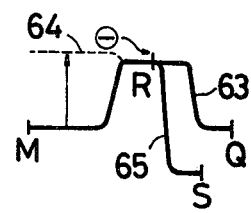
Figure 7A:
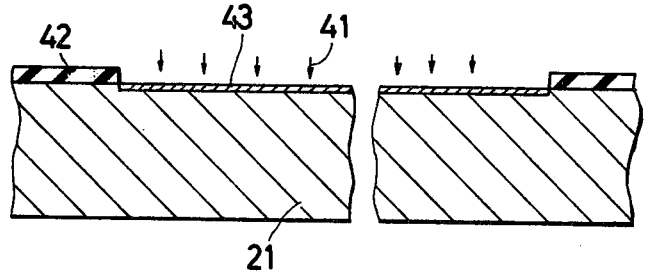
FIGS. 7A-7F illustrate the manufacturing process of the picture element in FIG. 4 in the order of steps A, B, C, D, E and F, and shows sectional views of a silicon substrate in the various steps.
Figure 7B:
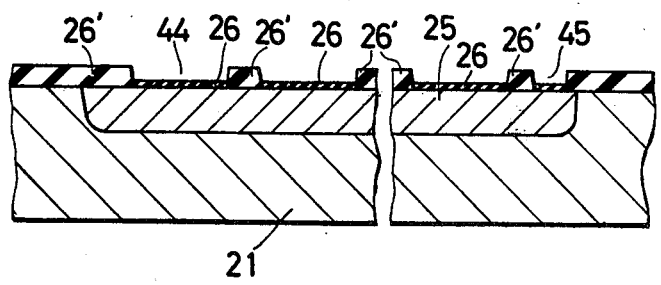
Figure 7C:
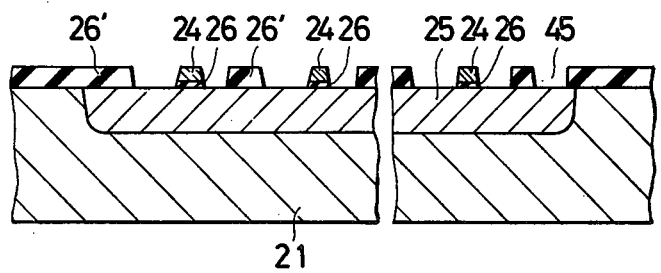
Figure 7D:
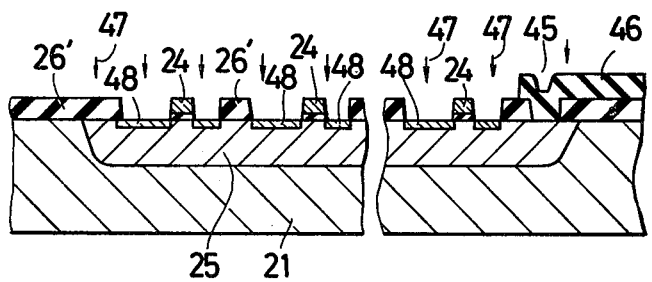
Figure 7E:
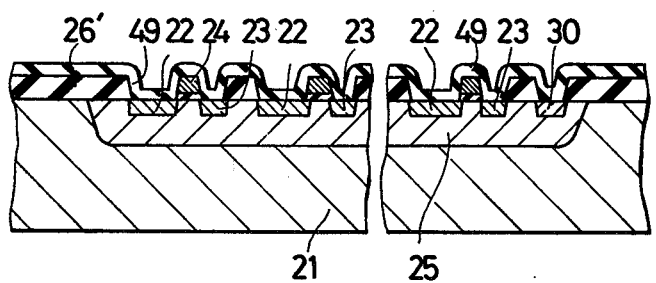
Figure 7F:
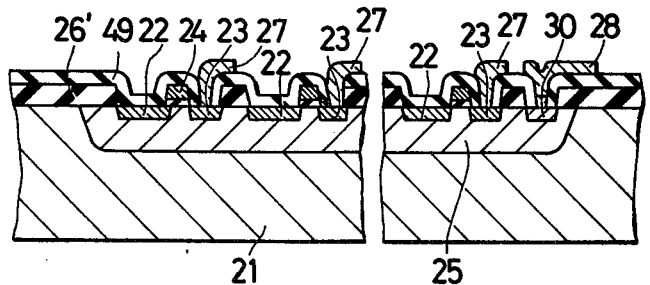

FIG. 6A shows a schematic section of a photodiode and a MOS transistor which constitute one picture element of the device of this invention. Six points M, N, P, Q, R and S are selected as typical points in the figure, and the relations of potentials among them are illustrated in FIGS. 6B and 6C.

Quite similarly to the foregoing case of the adjacent photodiodes, electrons from within the silicon substrate 21 and the well 25 do not flow into the n-type diffused layer 23 serving as the drain. Further, by making great the reverse bias between the silicon substrate 21 and the well 25 by the power source 29, the injection itself of electrons from the n-type diffused layer 22 can be restrained. It is possible to perfectly prevent blooming in the form of a vertical line.

When the scanning circuit for generating a voltage to be impressed on the gate electrode 24 is made independent of the well 25 of the picture element, it is possible to arbitrarily select the relation of voltages between the well 25 and the gate electrode 24, and the potential under the gate electrode 24 can be made a more desirable high state (flat band or accumulation level) in accordance with the bias of the power source 29. Concretely, the vertical scanning circuit may be formed on the silicon substrate 21 by p-channel type MOS Tr's, or it may be formed within a well separate from the well 25 of the picture element by n-channel type MOS Tr's.

Conventional expedients for improvements, such as the formation of an isolating p-type diffused layer under a field oxide film 26' and the formation of a thin p-type diffused layer under the gate electrode 24 for the purpose of regulating a threshold voltage, can perfectly remove the diffusing component of electrons within the well. Therefore, they have equivalent or greater effects.

By making the power source 29 variable as shown in FIG. 5A or FIG. 6A, the electronic control of the sensitivity is possible.

The impurity concentration and thickness of the p-type well 25 can be arbitrarily selected depending on desired values of the junction capacitances between the p-type well 25 and the n-type diffused layers 22 and 23, a desired spectral response, and values of the reverse bias to be used. The junction capacitance is substantially proportional to the square root of the impurity concentration of the well. As the well is thinner, the sensitivity to the light of longer wavelength can be restrained more easily. The value of the reverse bias enlarges substantially in proportion to the product of the square of the impurity concentration (and the thickness).

By way of example, in case where the impurity concentration of the well is $1 \times 10^{16}/cm^3$, the thickness thereof is 4 μm, and the impurity concentration of the silicon substrate 21 is $1 \times 10^{15}/cm^3$, the spectral response is roughly flattened at a reverse bias of 10 V, and the blooming does not occur even for light which is about 1,000 times greater than the saturation light quantity of the junction capacitance.

As stated above, the scanning circuit may adopt either P-channel type or N-channel type MOS transistors. Both the types can be formed on the same silicon substrate 21. When the MOS transistor is formed on the silicon substrate 21 along with the p⁻ diffused layer 30, the P-channel type transistor is obtained. When the MOS transistor is formed on the well 25 or a p-type diffused layer well separate therefrom by the same process as that of the picture element, the N-channel type transistor is obtained. Accordingly, the scanning circuit has no point to be specially attended to, and only the picture element will be referred to in the following description of the manufacturing method.

FIGS. 7A–7F illustrate an example of the manufacturing method of the device of this invention shown in FIG. 4.

A: A single crystal silicon (Si) substrate 21 having an n-type impurity concentration of about $10^{15}/cm^3$ is thermally oxidized, to form a silicon dioxide (SiO₂) film 42 having a thickness of about 0.5 μm. Subsequently, the SiO₂ film 42 is provided with an opening of a predetermined pattern corresponding to a well, and boron ions (B⁺) 41 are implanted to form an ion-implanted layer 43. The implantation energy is, for example, 50 KeV, and the implanted quantity is, for example, $4 \times 10^{12}/cm^2$.

B: Boron in the ion-implanted layer 43 is thermally diffused to form the p-type well 25 having a thickness of about 4 μm. Subsequently, the SiO₂ film 42 is removed, or the thermal oxidation is continuously carried out, to form an SiO₂ film 26' having a thickness of about 1 μm, and openings are provided at a transistor part 44 and a contact part 45 of the well 25. Subsequently, a gate-insulating film 26 having a thickness of about 0.1 μm is formed by the thermal oxidation process.

C: By the thermal decomposition of monosilane (SiH₄), a polycrystalline silicon layer having a thickness of about 0.5 μm is formed. A gate electrode 24 is formed by subjecting the polycrystalline silicon layer to selective etching. Subsequently, using the gate electrode 24 as a mask, the gate-insulating film except under the gate electrode 24 is etched and removed.

D: The contact part 45 of the well 25 is covered with resist 46, and phosphorus ions (P⁺) 47 are implanted to form a P⁺-implanted layer 48. The resist 46 may be substituted by phosphosilicate glass (PSG) containing highly doped phosphorus and easy to be dissolved, boresilicate glass (BSG), etc. In this case, the thermal deposition may be substituted for the ion implantation.

E: Likewise to the step D, the P⁺-implanted layer 48 is covered with resist, boron is ion-implanted and the thermal diffusion is carried out, to form n-type diffused layers 22 and 23 and a p⁺ diffused layer 30. Subsequently, a PSG film 49 having a thickness of 0.5 μm is formed.

F: Openings are provided in the PSG film 49 into predetermined patterns for a signal line and for the contact of the well 25, a conductive material such as aluminum (Al) having a thickness of about 1 μm is evaporated and it is selectively etched into a predetermined wiring pattern, to form the signal line 27 and an electrode for applying a reverse bias 28.

The p⁺ diffused layer 30 can be substituted by an n⁺ layer. The reason therefor is that, since the reverse bias is applied between the well 25 and the silicon substrate 21 at the time of operation, the junction between the n⁺ diffused layer and the well 25 becomes forward upon application of a negative voltage to the electrode 28, so that the purpose is achieved. In this case, it is possible to abolish covering the contact part 45 with resist at the step D and to omit the ion implantation of boron at the step E, so that the process can be simplified.

In the present embodiment, the steps after forming the well 46 at the step B do not especially differ from the conventional techniques for producing N-channel MOS Tr integrated circuits or complementary MOS Tr integrated circuits, and the manufacture can be easily made.

EMBODIMENT 2

Figure 8A:
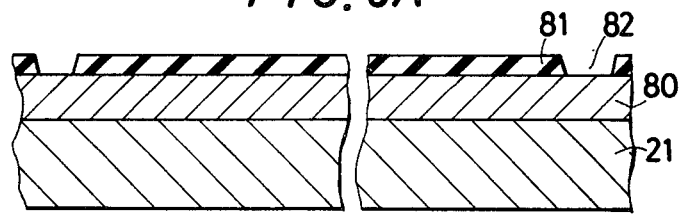
FIGS. 8A-8C illustrate the manufacturing process of a picture element in another embodiment of this invention in the order of steps A, B and C, and shows sectional views of a device (silicon substrate) in the various steps.
Figure 8B:
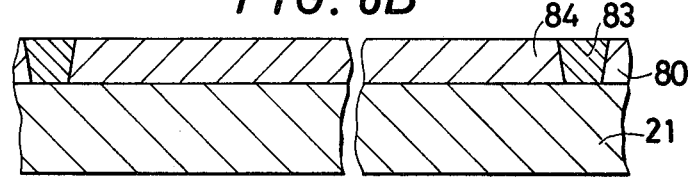
Figure 8C:
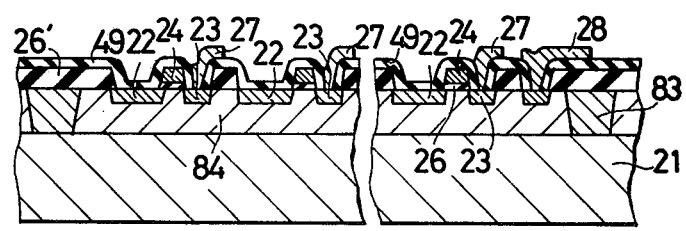

FIGS. 8A-8C illustrate another embodiment of the device of this invention, and shows sections of a picture element in the order of manufacturing steps A, B and C.

A: On the surface of a silicon (Si) single crystal substrate 21 having an n-type impurity concentration of, e.g., about $10^{16}/cm^3$, a p-type Si layer 80 containing about $10^{15}/cm^3$ of boron as an impurity and having a thickness of about 4 $\mu$m is formed by the epitaxial growth process. Subsequently, a silicon dioxide (SiO$_2$) film 81 having a thickness of about 1 $\mu$m is formed by the chemical vapor deposition (CVD) process or the thermal oxidation process, and an opening for diffusion 82 is provided. B: Phosphorus is thermally diffused through the opening 82, to form an n-type diffused layer 83 which reaches the Si substrate 21. The n-type diffused layer 83 divides the p-type Si layer 80, to form a well 84 which is electrically isolated from the surrounding material. Next, the SiO$_2$ film 81 is removed. C: Thereafter, the steps after the step B in the preceding embodiment (FIG. 7) are conformed with quite similarly (detailed description is omitted). Then, the device of this invention is obtained.

EMBODIMENT 3

Figure 9:
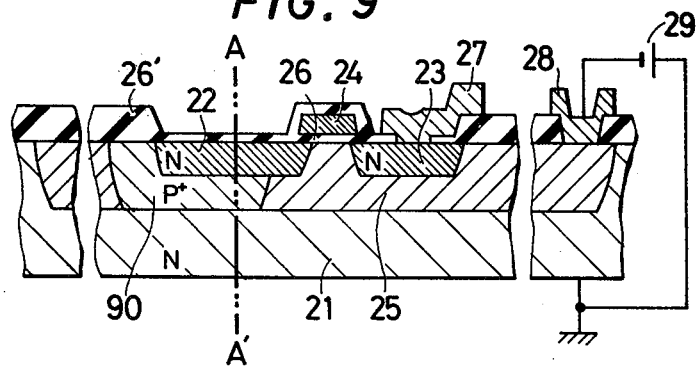
FIG. 9 is a sectional view showing the structure of a picture element in a third embodiment of this invention.

FIG. 9 illustrates a third embodiment of this invention, and shows a sectional structure of a picture element. A p-type layer 25 is formed in the surface of an n-type silicon (Si) substrate 21. With the p-type layer 25 regarded as the silicon body 11 in the prior-art structure (FIG. 2), there is formed a picture element which consists of an n-type diffused layer 22 forming a photodiode, an n-type diffused layer 23 serving as a drain, and a gate electrode 24. Further, a highly doped p+-type region 90 of a p-type impurity, e.g., B (boron) is disposed under the n-type diffused layer 22.

The p-type layer 25 is reverse-biased with respect to the Si substrate 21 by a power source 29 through an electrode 28 made of a conductive material such as Al (aluminum).

By such a structure and manner of use, all the problems in the prior art can be solved. Hereunder, they will be explained in succession.

Figure 2:
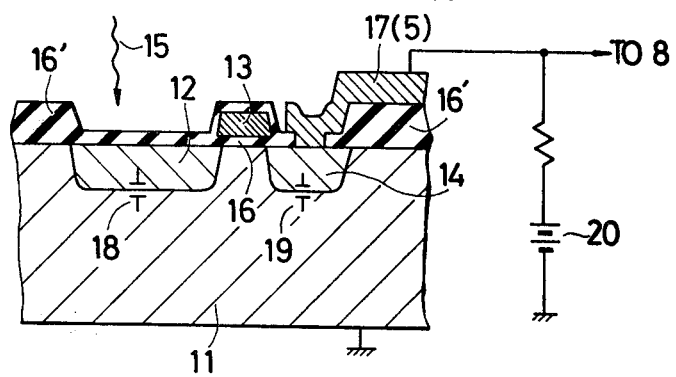
FIG. 2 is a sectional view showing the structure of a picture element (photoelectric element) of the prior-art solid-state imaging device.
Figure 3:
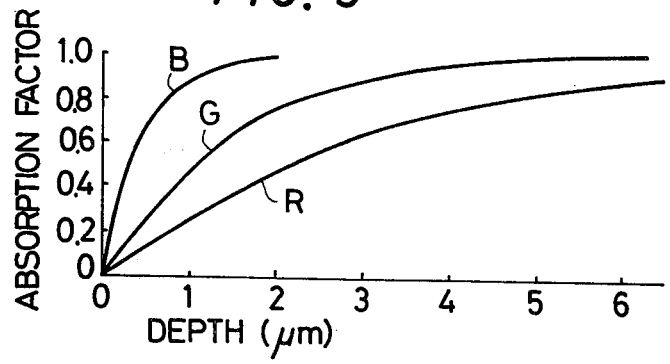
FIG. 3 is a diagram showing the absorption characteristics of silicon for lights of the three primary colors.

The junction capacitance is roughly determined by the impurity concentration of the p+ region 90, and it is substantially proportional to the square of the impurity concentration. Heretofore, in view of combined requests for uniformity in the threshold voltages of MOS transistors, signal capacitances, etc., a value of about $1 \times 10^{15}/cm^3$ has been adopted as the impurity concentration of the p-type Si body 11 (FIG. 2). When the impurity concentration of the p+ region 90 is made about $1 \times 10^{17}/cm^3$, the junction capacitance or signal capacitance increases approximately one order.

Unlike the prior art, the impurity concentration of the p-type layer 25 becomes substantially unrelated to the signal capacitance, so that the reason for making it high vanishes. That is, the junction capacitance of the n-type diffused layer 23 acting as the parasitic capacitance of the signal line can be made small by rendering the impurity concentration of the p-type layer 25 low.

Further, the junction capacitance and the operating characteristics of the MOS field effect transistor are determined by the impurity concentrations of the p+ region 90 and the p-type layer 25, and they are hardly affected by a nonuniformity in the silicon substrate 21. As a result, uniformity in the device characteristics is remarkably improved.

This invention also has remarkable effects on the spectral response, the degradation of resolution attributed to the light of longer wavelength, and blooming.

Figure 10:
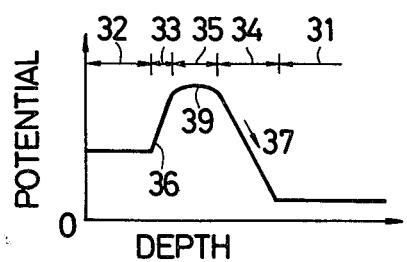
FIG. 10 is a diagram showing a potential curve for electrons as taken along line A-A' in FIG. 9.

FIG. 10 shows a potential curve 36 for electrons as taken along line A-A' in FIG. 9. In FIG. 10, a region 32 corresponds to the n-type diffused layer 22, a region 35 to the p+ region 90, a region 31 to the silicon substrate 21, and regions 33 and 34 to depletion layers of the respective pn-junctions. As is apparent from the figure, electrons created inside a top 39 of the potential curve shift to the silicon substrate 21 and are excluded as indicated by arrow 37. The position of the top 39 is the center of the p+ region 90 in case where the impurity concentration of the p+ region 90 is uniform and where potentials on both sides thereof are equal. It moves onto a higher side in case where there is a gradient of impurity density or in case where the potentials on both the sides have a difference.

In consequence, only the electrons generated in a deep place by the light of longer wavelength are removed, and the spectral response can be put into a desirable shape by selecting the position of the top 39. Simultaneously, the electrons developed in the deep place do not flow into the adjacent picture elements, and degradation of the resolution does not take place. Moreover, even where the intensity of incident light is high, merely the pn-junction is saturated, that is, the potential of the region 32 becomes equal to that of the region 35. The excess electrons do not flow into the adjacent picture elements, and flow out to the region 31 or the silicon substrate 21 and are excluded. Thus, blooming does not occur.

Hereunder, the operation of enhancing the resolution and excluding blooming will be explained with reference to the picture element structure of the present embodiment of this invention.

Figure 11:
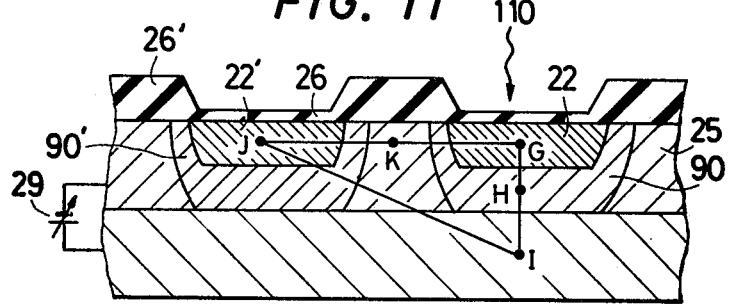
FIGS. 11, 12, 13A, 13B and 13C illustrate the effects of the picture element in FIG. 9 on resolution and blooming.
Figure 12:
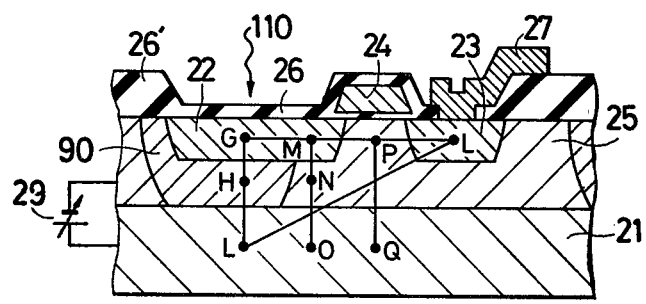

FIG. 11 is a schematic sectional view of two n-type diffused layers 22 and 22' constituting adjacent photodiodes, as well as the vicinity thereof, while FIG. 12 is a schematic sectional view of a photodiode and a MOS transistor constituting one picture element in the device of this invention.

Figure 13A:
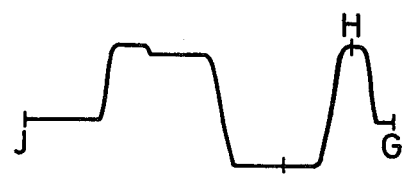
Figure 13B:
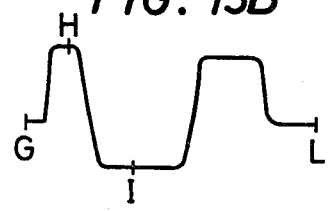
Figure 13C:
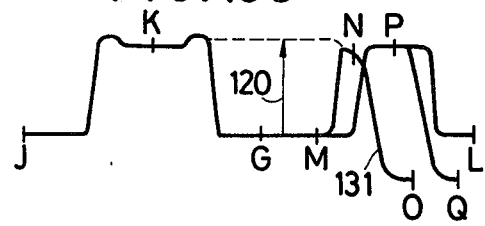

Points G-Q are selected as typical points in FIGS. 11 and 12, and the relations of potentials among the points are outlined in FIGS. 13A-13C.

Electrons created in the silicon substrate 21 are majority carriers here, and cannot enter the p-type layer 25 due to the reverse bias which is applied between the p-type layer 25 and the silicon substrate 21 by the power source 29. Naturally, they can flow neither into the n-type diffused layer 22 nor into the n-type diffused layer 22'. By way of example, the electrons developed at the point I are subject to high potential barriers towards the point G and also towards the point J as seen from FIG. 13A. They cannot exceed the barriers, and do not contribute to a photoelectric signal at all. Accordingly, the spectral response is corrected, and degradation of the resolution does not occur. The color mixture does not arise, either.

The effect similarly applies to the n-type diffused layer 23 connected to an output line 27 in FIG. 12 (refer to FIG. 13B).

Description will now be made of effect on the blooming in the case where the intensity of light 110 incident on the n-type diffused layer 22 is high.

When the intensity of the light 110 becomes high, the potential of the n-type layer 22 rises so that the p-type layer 25 and the n-type diffused layer 22 may be forward-biased (130 in FIG. 13C). The n-type layer 22 is surrounded by the p-type layer 25 and the p+ region 90. The p+ region 90 is higher in the p-type impurity concentration than the p-type layer 25 and is higher in the diffusion potential with respect to the n-type diffused layer 22, so that it forms a higher barrier for electrons than the p-type layer 25. For this reason, the injection of electrons takes place only in a portion lacking in the p+ region. In FIG. 12, it is in a direction from the point M towards the point P or the point N.

In such components of the injection, the component towards the point P flows into the n-type diffused layer 23 when left as it is, and it is added to the signals of the picture elements having the signal line 27 in common, so that the blooming in the shape of a vertical line is developed. Here, a sufficient reverse bias is applied between the p-type layer 25 and the silicon substrate 21 by the power source 29, whereby the depletion layer can be spread from the side of the silicon substrate 21 onto the side of the n-type diffused layer 22, and the barrier between the point M and the point O as represented by the point N can be made lower than the barrier of a region represented by the point P as indicated by a potential curve 131 in FIG. 13C. After all, the potential of the n-type layer 22 becomes lower than that of the point P, and it becomes impossible for the excess electrons to exceed the barrier towards the point P. Accordingly, the excess electrons pass through the point N and are absorbed by the point O or the substrate.

Measures of improvements similar to those of the prior art, such as setting at a value below a flat band voltage the voltage which is applied to the gate electrode 24 and which cuts off the channel, and as a conventional expedient of forming an enhancement type MOS transistor in which the p-type impurity concentration under the gate electrode 24 is raised, demonstrate greater effects in of this invention. Such disposals make the potential of the point P in FIG. 12 higher than that of the point N and render the barrier higher. Simultaneously, they produce a drift electric field which direct the electrons from the point P towards the point Q within the silicon substrate 21, and can cut off the electrons flowing into the n-type diffused layer 23. These expedients are several modifications for merely making the best use of the device of this invention more perfectly. In contrast to the prior-art device, the scanning circuit which generates scanning pulses to be impressed on the gate electrodes 24 can be very easily realized in such a manner that it is formed of P-channel devices disposed on the silicon substrate 21 or that it is formed on a p-type layer electronically isolated from the picture elements. Needless to say, the electrons advancing from the point M towards the point L, including the electrons advancing towards the point N, have a component towards the silicon substrate 21 as advances towards the point Q in the course. Without especially taking the modification expedient as stated above, therefore, the effect of greatly suppressing linear blooming is achieved.

The presence of the p+ region greatly lowers the effective sheet resistance of the p-type layer 25. As a result, the device of this invention has the subsidiary effect that the potential of the p-type layer 25 of high sheet resistance is restrained from fluctuating greatly due to, e.g., capacitance couplings with a photo current and a drive pulse, so stable operations of the device are secured.

The specifications of the p-type layer 25 and the p+ region 90 can be appropriately selected depending on the operating conditions, processing techniques to be applied, and desired characteristics. Assuming by way of example that the operating voltage is about 10 V, where no electron vanishes by surface recombination, spectral response to the visible light becomes substantially flat when the position of the top 39 lies at about 3 $\mu$m from the surface. However, in the case of relying on conventional techniques for fabricating semiconductor integrated circuits, a value of about 2 $\mu$m is suitable because of surface recombination. The calculation of such conditions may be carried out. Although no special restriction is intended, a construction which is greatly effective and which is easy to handle will be such that the impurity concentration of the p+ region 90 is $10^{16}$–$10^{18}$/cm$^3$, while the depth of the bottom thereof is about 2–6 $\mu$m, and that the impurity concentration of the p-type layer 25 is $10^{14}$–$10^{16}$/cm$^3$, while the depth of the bottom thereof is about 2–10 $\mu$m. Needless to say, regarding the thicknesses of the p+ region 90 and the p-type layer 25, the bottoms need not be uniform as shown in FIG. 9, but either the region or the layer may be thicker. The p+ region 90 (under the n-type diffused layer 22 and in the vicinity of the gate electrode 24) may avoid only portions under the gate electrode 24 and under the n-type diffused layer 23 serving as the drain. By way of example, it may extend also under the thick part 26' (called the field region) of the SiO$_2$ film, or may be situated under the electrode 28. Such a measure is effective to prevent the occurrence of a parasitic channel due to an interface phenomenon between Si and SiO$_2$ or to improve the electrical connection between the p-type layer 25 and the electrode 28, and can be said to be rather desirable. Likewise, a p+ diffused layer which is conventional means for improving electrical connection may be separately disposed under the electrode 28.

Figure 14A:
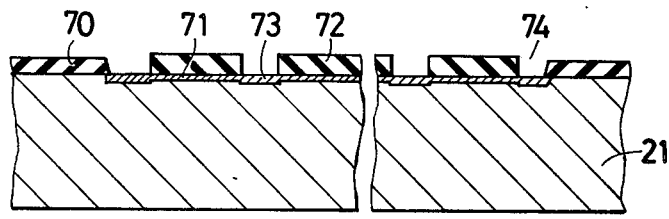
FIGS. 14A-14D illustrate the manufacturing process of the picture element in FIG. 9 in the order of steps A, B, C and D, and shows sectional views of a silicon substrate in the various steps.
Figure 14B:
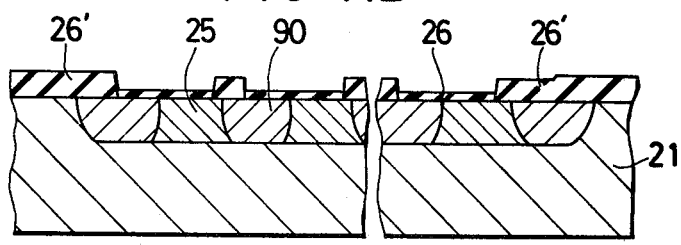
Figure 14C:
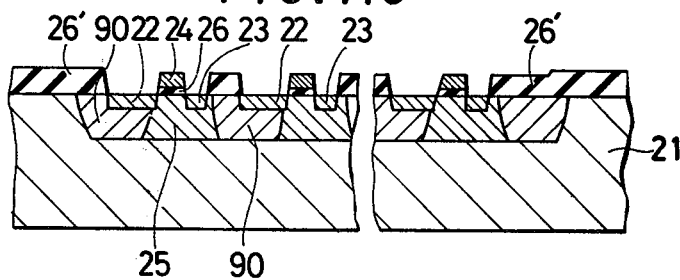
Figure 14D:
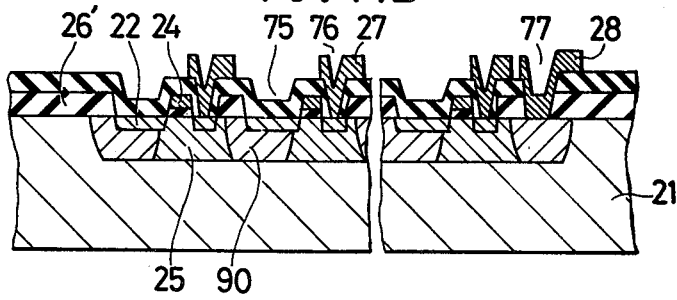

An example of the method of manufacturing the device of the present embodiment will be explained with reference to FIGS. 14A–14B. In the figure, only the photoelectric portion forming the essence of this invention is illustrated.

A: An n-type silicon (Si) substrate 21 whose impurity concentration is about $10^{14}$/cm$^3$ is thermally oxidized to form a silicon dioxide (SiO$_2$) film 70 whose thickness is about 0.5 $\mu$m. Subsequently, openings are provided in the SiO$_2$ film 70 in correspondence with regions to become the p-type layer and the p+ region, and boron ions are implanted at a density of about $4\times10^{11}$/cm$^2$, to form an ion-implanted layer 71. Next, resist 72 is applied, an opening is provided in the resist above the region to become the p+ region, and boron ions are implanted at a density of about $4\times10^{13}$/cm$^2$, to form an ion-implanted layer 73. In the present embodiment, the opening 74 is provided where the p+ region is formed under the electrode for impressing the bias voltage on the p-type layer.

B: After removing the resist 72, the ion-implanted layers 71 and 73 are extended by thermal oxidation or the thermal diffusion added thereto, to form the p-type layer 25 and the p+ region 90 about 4 $\mu$m thick and to form the SiO$_2$ film 26' about 1 $\mu$m thick. The SiO$_2$ film 70 may well be removed before this step. Subsequently, the SiO$_2$ film 26 is provided with an opening in correspondence with a region to become the picture element, and the $SiO_2$ film 26 about 0.1 μm thick is formed by the thermal oxidation.

C: A polycrystalline silicon layer which is about 0.5 μm thick is formed, and the gate electrode 24 is formed by conventional lithographic technology. Subsequently, silicon of a region to become the n-type diffused layer is exposed with the $SiO_2$ film 26 left only under the gate electrode 24. Next, phosphorus is thermally diffused to form the n-type diffused layers 22 and 23 which are about 0.5 μm thick.

D: A phosphosilicate glass layer 75 which is about 1 μm thick is formed, openings 76 and 77 for establishing electrical connections to the drain portion and the p-type layer 12 of the picture element are provided, and electrodes 27 and 28 made of a conductive material such as aluminum (Al) are formed.

In this way, there is produced a device which has the p-type layer 25 at an impurity concentration of about $10^{15}/cm^3$ and the p+ region 90 at an impurity concentration of about $10^{17}/cm^3$. The steps after forming the p-type layer 25 and the p+ region 90 at the step B do not differ from conventional steps for fabricating an N-channel type MOS device, and hence, the device of this invention can be realized very easily.

By quite the same steps, the scanning circuit can be formed on a well identical to, or separate from, the p-type layer 25 (N-channel type). The scanning circuit of the P-channel type can be formed on the silicon substrate 21 by adding in the step C the step of thermally diffusing boron into only a scanning circuit portion.

EMBODIMENT 4

Figure 15A:
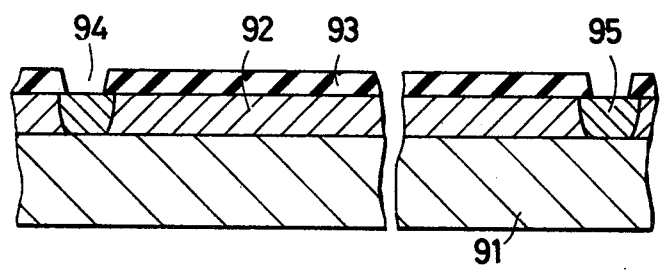
FIGS. 15A–15B illustrate the manufacturing process of a picture element in a fourth embodiment of this invention in the order of steps A and B, and shows sectional views of a silicon substrate in the respective steps.
Figure 15B:
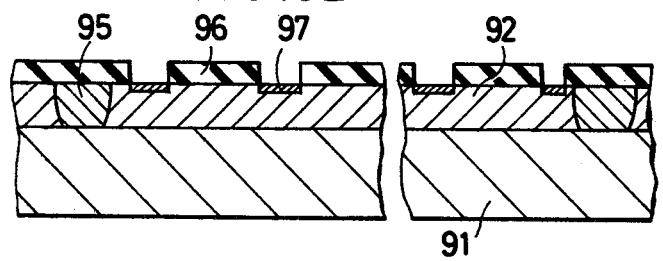

Another example of the method of manufacturing the device of this invention is illustrated in FIGS. 15A-15B. This exemplifies a case where a p-type layer is formed by epitaxial growth.

A: On the surface of an n-type silicon substrate 91 whose impurity concentration is about $5 \times 10^{15}/cm^3$, a p-type layer 92 made of a silicon single crystal layer which contains boron (B) at a concentration of about $1 \times 10^{14}/cm^3$ as an impurity and which is about 5 μm thick is formed by the epitaxial growth. Subsequently, a silicon dioxide ($SiO_2$) film 93 having a thickness of about 0.5 μm is formed by such an expedient as vapor growth, and an opening 94 is provided into a shape surrounding active regions such as a photoelectric portion and a scanning circuit portion. Next, an impurity forming the n-type conductivity such as phosphorus is thermally diffused through the opening, to form an n+ diffused layer 95. The n+ diffused layer 95 functions to isolate the p-type layer 92, and it need not always reach the silicon substrate 91. The reason therefor is that a depletion layer which is spread by the reverse bias applied between the p-type layer 92 and the silicon substrate 91 at the time of operation as stated previously fills up a gap remaining between the n+ diffused layer 95 and the silicon substrate 91 and isolates the p-type layer 92 electrically.

B: The $SiO_2$ film 93 is removed, resist 96 is applied, and an opening is provided in a region to become the p+ region. Subsequently, an ion-implanted layer 97 containing boron at a concentration of about $4 \times 10^{13}/cm^2$ is formed by the ion implantation.

Thereafter, steps similar to those after the step B in the foregoing embodiment (FIGS. 14A-14D) are conformed with (detailed description is omitted). Then, the device of this invention can be obtained.

The feature of the present embodiment is that the impurity concentration of the p-type layer can be set irrespective of the impurity concentration of the silicon substrate. That is, irrespective of the silicon substrate employed, the impurity concentration of the p-type layer can be lowered ($1 \times 10^{14}/cm^3$ in the present embodiment), and the parasitic capacitance of the signal line can be remarkably lowered.

In the manufacturing method of the present embodiment, the surface of the silicon substrate 91 is not exposed, and hence, the scanning circuit portion is constructed of N-channel type transistors.

EMBODIMENT 5

Figure 16A:
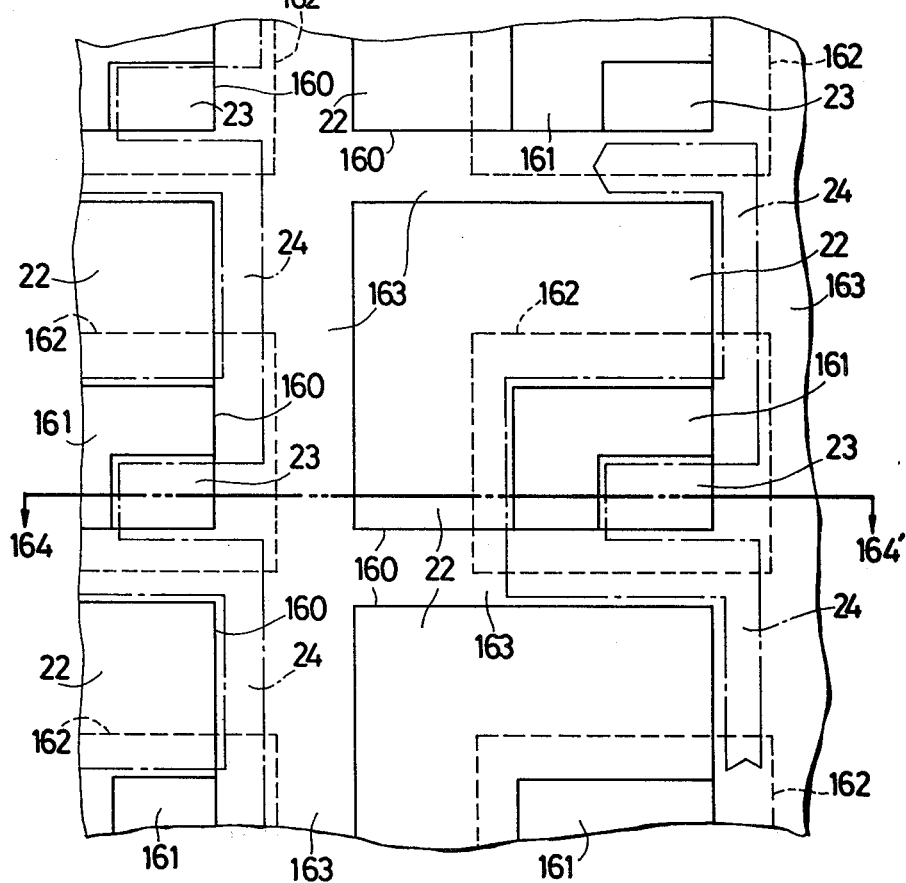
FIG. 16A illustrates a fifth embodiment of this invention, and is a plan view showing a layout pattern of picture elements of a solid-state imaging device.
Figure 16B:
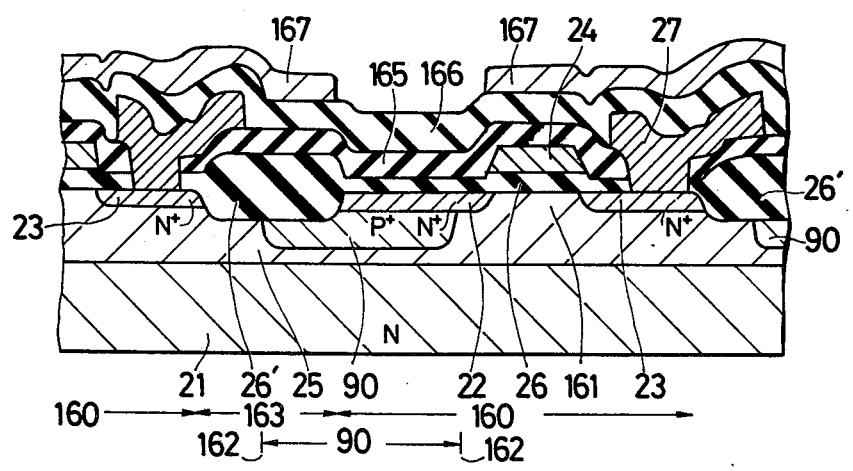
FIG. 16B is a view showing a section taken along line 164–164' in FIG. 16A.

FIG. 16A and FIG. 16B show the layout of respective picture elements in the solid-state imaging device of this invention and an example of the sectional structure of the picture element along line 164-164', respectively. In FIG. 16A, numeral 160 designates the demarcation of the picture element. Within the region 160, there are included a highly doped n-type impurity layer 22 constituting a photodiode, and a gate 24, a channel region 161 and a drain 23 of a MOS Tr. A region 163 between the adjacent picture elements forms an isolation region, and is provided with a thick $SiO_2$ film 26'. In FIG. 16A, a dotted line 162 is the boundary line of a highly doped p-type impurity layer 90. The p-type impurity layers 90 are formed in the shape of lattices within the semiconductor substrate.

In the sectional view of FIG. 16B, the highly doped p-type impurity layer 90 does not lie in contact with the substrate 21, but it has the same effect as in the preceding embodiments. In the device of FIG. 16B, numeral 165 designates a PSG film, and numeral 166 an $SiO_2$ film. Numeral 167 indicates a reflecting film of aluminum (Al) or the like, which causes incident light to enter only the photodiode portion and prevents light from entering any other portion and giving rise to a noise. In FIG. 16B, the same parts as in FIG. 9 are assigned the same numerals.

As set forth above, according to this invention, the signal capacitance of a solid-state imaging device is sharply increased and the parasitic capacitance of a signal line is suppressed to a small value, the spectral response is corrected, and the degradation of resolution and blooming which are attributed to the dispersion of signal charges by light incident on any other picture element do not occur, so that the solid-state imaging device of high picture quality can be readily realized.

Needless to say, insofar as the spirit of this invention is not departed from, the various specifications of materials and numerical values employed in the description are not restrictive at all. The description of this invention teaches the most fundamental construction. Means for improvements usually added to a solid-state imaging device, for example, the addition of an anti-reflective layer or a light shield layer for avoiding light impingement on unnecessary areas and the addition of a filter for color image pickup are naturally considered in and applicable to the device of this invention. They achieve similar effects in the device of this invention.

What is claimed is:
1. A solid-state imaging device comprising
a semiconductor substrate of a first conductivity type having a first surface region of a second conductivity type opposite to said first conductivity type, means for biasing backwardly a pn junction which is constituted by said substrate and said first surface region, and a plurality of picture elements disposed in said first surface region, each of said picture element being comprised of:
(i) a picture element region disposed in said first surface region and provided so as to be isolated from other picture elements;
(ii) a first region of said first conductivity type disposed in said picture element region and constituting a pn-junction diode together with said first surface region; and
(iii) detective means for detecting signal charges stored in a junction capacitance of said pn-junction diode.

2. A solid-state imaging device according to claim 1, further comprising
a scanning circuit provided in said semiconductor substrate and arranged in the peripheral part thereof with respect to said picture elements.

3. A solid-state imaging device according to claim 2, wherein said scanning circuit is provided in said first surface region.

4. A solid-state imaging device according to claim 2, further comprising
a second surface region of said second conductivity type disposed in said semiconductor substrate,
and wherein said scanning circuit is provided in said second surface region.

5. A solid-state imaging device according to claim 2, wherein said scanning circuit is provided in a region of said semiconductor substrate other than said first surface region.

6. A solid-state imaging device according to claim 1, wherein said detective means includes
(i) a second region of said first conductivity type disposed in said picture element region,
(ii) a gate insulating film provided so as to cover a region lying between said first region and said second region, and
(iii) a gate electrode disposed on said gate insulating film.

7. A solid-state imaging device according to claim 2, wherein said picture elements are arranged in a two dimensional array and scanning circuit includes a first scanner addressing a horizontal direction of said array and a second scanner addressing a vertical direction of said array.

8. A solid-state imaging device according to claim 1, further comprising a photo shield layer consisting of a opaque material, having windows, and covering said detective means so as to permit incident light to illuminate only said pn-junction diodes.

9. A solid-state imaging device according to claim 1, wherein said picture element is further comprised of:
(iv) a third region of said second conductivity type having an impurity concentration higher than that of said first surface region and disposed under said first region.

10. A solid-state imaging device according to claim 0, wherein said third region is included in said first surface region.

11. A solid-state imaging device according to claim 9, wherein said third region abuts said pn junction between said first surface region and said semiconductor substrate.

12. A solid-state imaging device according to claim 9, wherein said third region projects beyond said first surface region toward said semiconductor substrate.

13. A solid-state imaging device according to claim 9, wherein said third region is disposed under a part of said first region.

14. A solid-state imaging device according to claim 1, wherein the thickness of said first surface region is from $2\mu m$ to $10\mu m$, and the impurity concentration of said first surface region is in the range from $1\times 10^{14}/cm^3$ to $1\times 10^{16}/cm^3$.

15. A solid-state imaging device according to claim 9, wherein said first surface region has a thickness in the range from $2\ \mu m$ to $10\ \mu m$ and an impurity concentration in the range from $1\times 10^{14}/cm^3$ to $1\times 10^{16}/cm^3$.

16. A solid-state imaging device according to claim 15, wherein said third region has a thickness in the range from $2\mu m$ to $6\mu m$ and an impurity concentration in the range from $1\times 10^{16}/cm^3$ to $1\times 10^{18}/cm^3$.

17. A solid-state imaging device according to claim 1, wherein said means for biasing backwardly a pn junction includes
(i) a first electrode provided so as to be electrically connected to said first surface region,
(ii) a second electrode provided so as to be electrically connected to said semiconductor substrate, and
(iii) a voltage source electrically connected between said first and second electrodes.

18. A solid-state imaging device according to claim 6, wherein said detective means further includes means for supplyiing a target voltage which has a predetermined voltage value to said second region.

19. A solid-state imaging device according to claim 18, wherein said detective means further inclues a detective electrode disposed on said second region, and wherein said target voltage is supplied to said detective electrode.

20. A solid-state imaging device comprising
a semiconductor substrate of a first conductivity type having a major surface and having a first surface region of a second conductivity type opposite to said first conductivity type,
means for biasing backwardly a pn junction which is constituted by said substrate and said first surface region, and
a plurality of picture elements disposed in said first surface region, said picture elements being comprised of:
(i) a picture element region disposed in said first surface region and provided so as to be isolated from other picture elements;
(ii) a MOS structure having a transparent insulating film which is disposed on said major surface so as to cover a photosensitive region in said picture element region, having a transparent gate electrode which is disposed on said transparent insulating film and is supplied with a predetermined voltage so as to form an inversion layer under said transparent insulating film, and functioning as an electrostatic capacitance; and
(iii) detective means for detecting signal charges stored in said photosensitive region.

21. A solid-state imaging device according to claim 20, wherein said detective means includes
(i) a detective region of said first conductivity type disposed in said picture element region, (ii) a transfer-gate insulating film disposed on said major surface so as to cover a region lying between said photosensitive region and said detective region, and
(iii) at least one transfer-gate electrode disposed on said transfer gate insulating film.

22. A solid state imaging device according to claim 20, wherein said picture element is further comprised of:
(iv) a highly doped region of said second conductivity type having an impurity concentration higher than that of said first surface region and disposed in said photosensitive region.

* * * * *